US012638786B2

(12) United States Patent
Verschuren et al.

(10) Patent No.: US 12,638,786 B2
(45) Date of Patent: May 26, 2026

(54) METHOD AND APPARATUS FOR IMAGING NONSTATIONARY OBJECT

(71) Applicant: ASML Netherlands B.V., Veldhoven (NL)

(72) Inventors: Coen Adrianus Verschuren, Eindhoven (NL); Ferry Zijp, Nuenen (NL); Nitesh Pandey, Silicon Valley, CA (US); Alexander Prasetya Konijnenberg, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 338 days.

(21) Appl. No.: 18/039,373

(22) PCT Filed: Nov. 16, 2021

(86) PCT No.: PCT/EP2021/081764
§ 371 (c)(1),
(2) Date: May 30, 2023

(87) PCT Pub. No.: WO2022/117325
PCT Pub. Date: Jun. 9, 2022

(65) Prior Publication Data
US 2024/0004313 A1      Jan. 4, 2024

(30) Foreign Application Priority Data

Dec. 1, 2020     (EP) ..................................... 20210884

(51) Int. Cl.
*G01B 11/14*      (2006.01)
*G01B 11/27*      (2006.01)
(Continued)

(52) U.S. Cl.
CPC ...... *G03F 7/706851* (2023.05); *G01B 11/272* (2013.01); *G01N 21/956* (2013.01);
(Continued)

(58) Field of Classification Search
None
See application file for complete search history.

(56) References Cited

U.S. PATENT DOCUMENTS 6,952,253 B2     10/2005   Lof et al.
6,961,116 B2     11/2005   Den Boef et al.
(Continued)

FOREIGN PATENT DOCUMENTS

CN          1525142 A      9/2004
CN       102305588 A      1/2012
(Continued)

OTHER PUBLICATIONS

International Search Report and Written Opinion of the International Searching Authority directed to International Patent Application No. PCT/EP2021/081764, mailed Feb. 23, 2022; 12 pages.
(Continued)

*Primary Examiner* — Carl Adams
(74) *Attorney, Agent, or Firm* — Finnegan, Henderson, Farabow, Garrett & Dunner LLP

(57)      ABSTRACT

Disclosed is an optical imaging system, and associated method, comprising a stage module configured to support an object such that an area of the object is illuminated by an illumination beam; an objective lens configured to collect at least one signal beam, the at least one signal beam originating from the illuminated area of the object; an image sensor configured to capture an image formed by the at least one signal beam collected by the objective lens; and a motion compensatory mechanism operable to compensate for relative motion of the stage module with respect to the objective lens during an image acquisition. The motion compensatory mechanism causes a compensatory motion of one or more of: said objective lens or at least one optical element thereof; said image sensor; and/or an optical ele-
(Continued)

ment comprised within a detection branch and/or illumination branch of the optical imaging system.

20 Claims, 7 Drawing Sheets

(51) Int. Cl.

| | |
|---|---|
| *G01N 21/956* | (2006.01) |
| *G02B 27/64* | (2006.01) |
| *G03F 7/00* | (2006.01) |

(52) U.S. Cl.
CPC ....... *G02B 27/646* (2013.01); *G03F 7/70633* (2013.01); *G03F 7/7065* (2013.01); *G01N 2201/063* (2013.01)

(56) References Cited

U.S. PATENT DOCUMENTS

| | | | |
|---|---|---|---|
| 7,265,364 | B2 | 9/2007 | Teunissen et al. |
| 7,456,967 | B2 | 11/2008 | Fukui et al. |
| 7,646,471 | B2 | 1/2010 | Teunissen et al. |
| 7,701,577 | B2 | 4/2010 | Straaljer et al. |
| 7,791,724 | B2 | 9/2010 | Den Boef et al. |
| 8,115,926 | B2 | 2/2012 | Straaijer |
| 8,243,273 | B2 | 8/2012 | Levinski et al. |
| 8,497,976 | B2 | 7/2013 | Corbeij et al. |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,134,503 | B2 | 9/2015 | Topliss |
| 9,675,430 | B2 | 6/2017 | Verker et al. |
| 11,451,599 | B2 | 9/2022 | Lundholm |
| 2002/0048027 | A1 | 4/2002 | Pettersen et al. |
| 2008/0198380 | A1 | 8/2008 | Straaijer et al. |
| 2009/0141352 | A1 | 6/2009 | Jannard et al. |
| 2009/0168062 | A1 | 7/2009 | Straaijer |
| 2010/0007863 | A1 | 1/2010 | Jordanoska |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0032500 | A1 | 2/2011 | Straaljer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaljer |
| 2013/0162996 | A1 | 6/2013 | Straaljer et al. |
| 2013/0308142 | A1 | 11/2013 | Straaljer |
| 2013/0321811 | A1* | 12/2013 | Maeda .................. G03F 9/7084 |
| | | | 356/400 |
| 2014/0098369 | A1 | 4/2014 | Blasenheim et al. |
| 2015/0261097 | A1 | 9/2015 | Mathijssen et al. |
| 2016/0161863 | A1 | 6/2016 | Den Boef et al. |
| 2016/0291479 | A1 | 10/2016 | Feijen et al. |
| 2016/0370717 | A1 | 12/2016 | Den Boef et al. |
| 2017/0351188 | A1 | 12/2017 | Ueda |
| 2018/0164573 | A1 | 6/2018 | Tetaz |
| 2019/0228518 | A1 | 7/2019 | Manassen et al. |

FOREIGN PATENT DOCUMENTS

| | | |
|---|---|---|
| CN | 105829969 A | 8/2016 |
| CN | 107076985 A | 8/2017 |
| EP | 1628164 B1 | 10/2010 |
| JP | H09-079991 A | 3/1997 |
| JP | 2005-195338 A | 7/2005 |
| JP | 2007-115801 A | 5/2007 |
| JP | 2008241662 A | 10/2008 |
| JP | 2009-026976 A | 2/2009 |
| JP | 2017-502346 A | 1/2017 |
| TW | 201224667 A | 6/2012 |
| WO | 2011012624 A1 | 2/2011 |
| WO | 2016102127 A1 | 6/2016 |

OTHER PUBLICATIONS

International Preliminary Report on Patentability directed to International Patent Application No. PCT/EP2021/081764, issued May 30, 2023; 9 pages.
Japanese Notice of Reasons for Refusal directed to Japanese Patent Application No. 2023-527794, mailed Aug. 28, 2025; 11 pages.

* cited by examiner

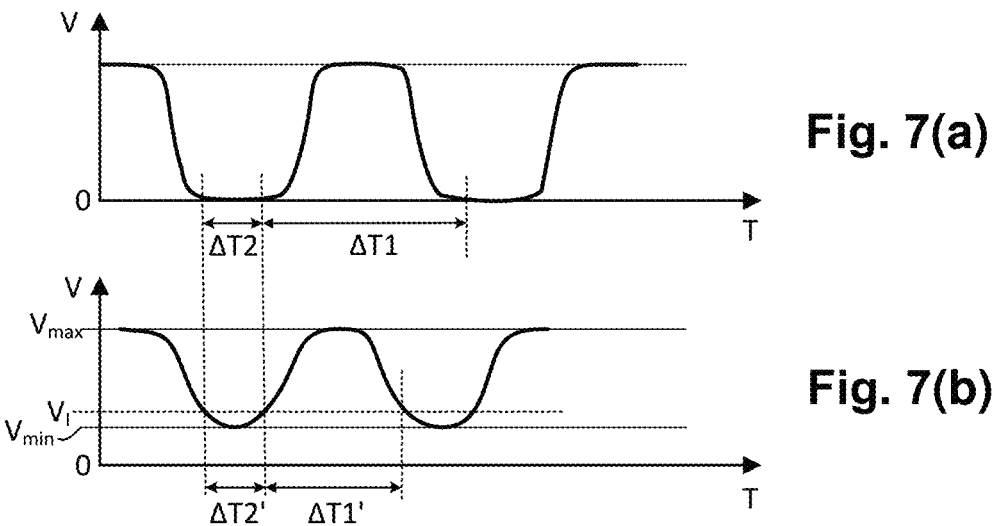
Fig. 7(a)
Fig. 7(b)
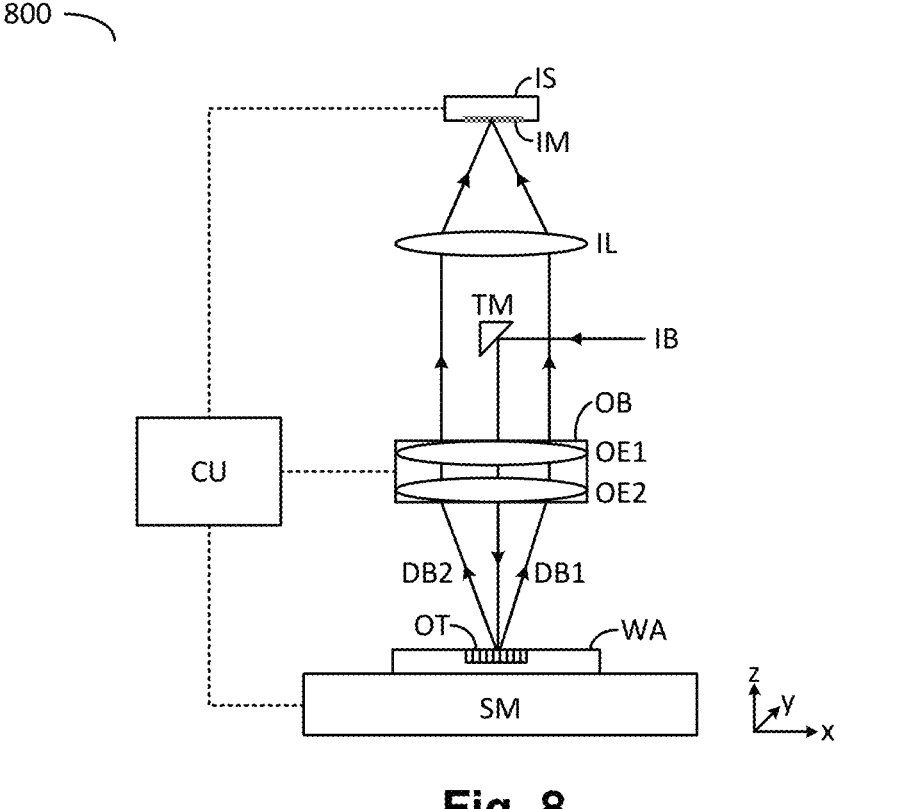
Fig. 8

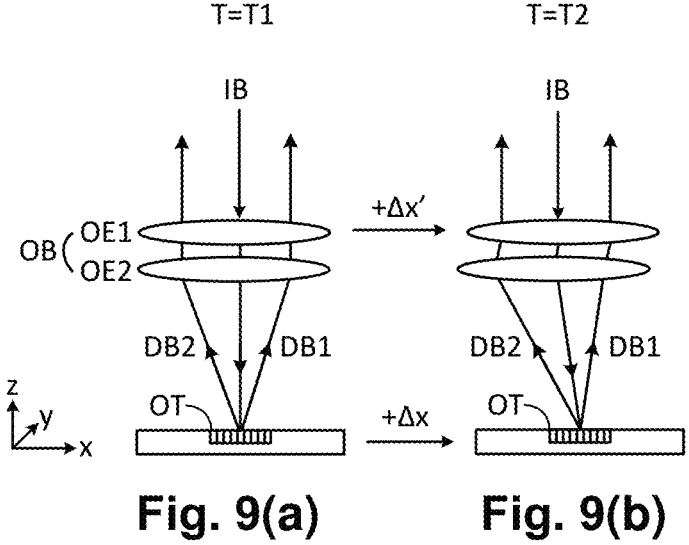
Fig. 9(a)          Fig. 9(b)
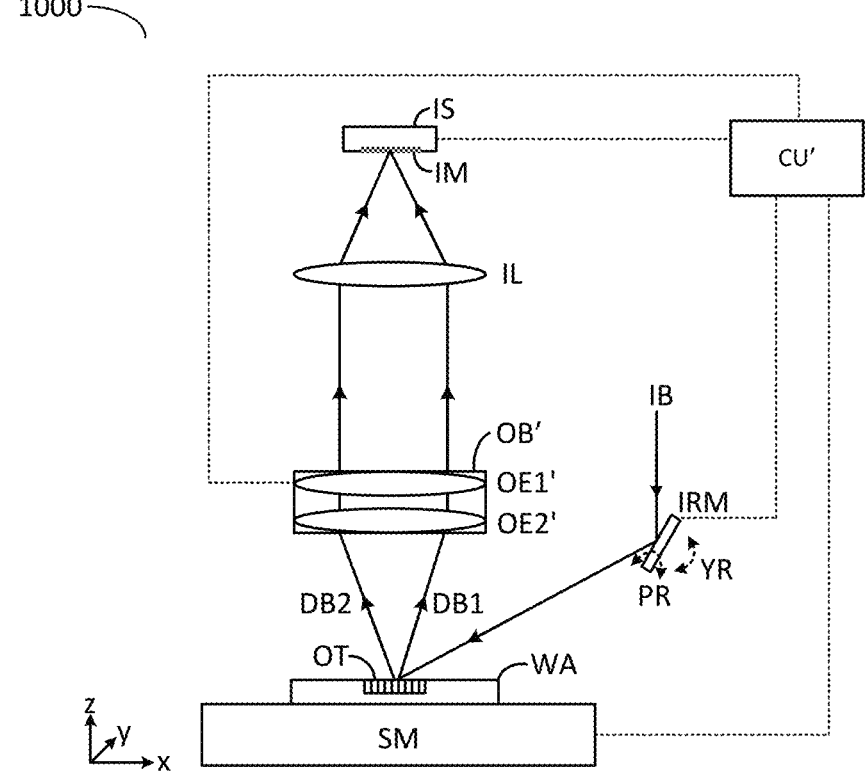
Fig. 10

1100

$I(x,y)$ $h(x,y)$ → | $I*h+n$ | → | CNN | → $I'(x,y)$

PE

METHOD AND APPARATUS FOR IMAGING NONSTATIONARY OBJECT

CROSS-REFERENCE TO RELATED APPLICATIONS

This application claims priority of EP application 20210884.1 which was filed on Dec. 1, 2020 and which is incorporated herein in its entirety by reference.

FIELD

The present invention relates to methods and apparatuses for imaging nonstationary objects, and in particular such methods and apparatuses in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a positioner or stage module may be required to accurately position a substrate support which holds a substrate. In these applications, optical measurement or inspection over more than one area of a substrate is often desired. For example, overlay is typically measured over multiple overlay targets or marks located at different positions on a wafer for each process layer. After a current overlay target is measured, the positioner moves the wafer with respect to the position of an objective lens such that a next target is positioned under the objective lens and aligned with an illumination beam that is focused by the objective lens.

The Move-Acquire-Measure time (MAM) is the time that is taken to 'Move' the wafer from the current overlay target to the next overlay target, 'Acquire' an image of the next overlay target, and 'Measure' or compute an overlay value. The MAM determines throughput of a metrology or inspection tool. According to the current state of the art, due to compromise with increased size, complexity and cost of e.g., faster stage platform, a large part of the 'Move' time is spent on deceleration and acceleration of moving masses (e.g., a heavy substrate support, or the image sensor) to attain a completely or substantially stationary target with respect to imaging optics of the tool (e.g., objective lens, image sensor) during image acquisition. A non-stationary target will lead to a distorted (or blurry) image. Since acquired images are typically used to compute or determine the value of a parameter of interest (e.g., overlay value), an image with poor quality will result in loss of measurement performance (e.g., a lower measurement accuracy or reproducibility). The time needed to transition between a fast moving state and a stationary state is a significant part of the MAM time, and therefore this is limiting throughput. Increasing throughput at given stage complexity or reducing stage complexity at same throughput is an objective of the present invention.

SUMMARY

In a first aspect of the invention there is provided an optical imaging system, comprising: a stage module configured to support an object such that an area of the object is illuminated by an illumination beam; an objective lens configured to collect at least one signal beam, the at least one signal beam originating from the illuminated area of the object; an image sensor configured to capture an image formed by the at least one signal beam collected by the objective lens; and a motion compensatory mechanism operable to compensate for relative motion of the stage module with respect to the objective lens during an image acquisition by causing a compensatory motion of one or more of: said objective lens or at least one optical element thereof; said image sensor; and/or an optical element comprised within a detection branch and/or illumination branch of the optical imaging system.

In a second aspect of the invention there is provided a method for imaging an object using an optical imaging system, comprising: illuminating an area of the object with an illumination beam; collecting at least one signal originating from the illuminated area of the object during an acquisition period during at least a portion of which said object is non-stationary; acquiring an image from the at least one signal beam on an image sensor; and performing a compensatory motion of an optical element of the optical imaging system during said acquisition period to compensate for relative motion of the object with respect to an objective lens module used to collect the at least one signal during the acquisition period such that the image is maintained at substantially the same position on the image sensor during the acquisition period.

Other aspects of the invention comprise metrology device comprising the optical system of the second aspect.

BRIEF DESCRIPTION OF THE DRAWINGS

Embodiments of the invention will now be described, by way of example only, with reference to the accompanying schematic drawings, in which:

FIGS. 7(a)-7(b) show two diagrams illustrating respectively the moving speed of a sample as a function of time for the cases where image acquisition is performed while the sample is completely stationary (top diagram), and for the cases where image acquisition is performed while the sample is still in motion (bottom diagram).

FIG. 8 depicts schematically an embodiment of a scatterometer metrology tool in a first configuration;

FIGS. 9(a)-9(b) depict schematically operating principle of motion compensation implemented in the first configuration of the scatterometer metrology tool in accordance with an embodiment;

FIG. 10 depicts schematically an embodiment of the scatterometer metrology tool in a second configuration;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

<Reticle>

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
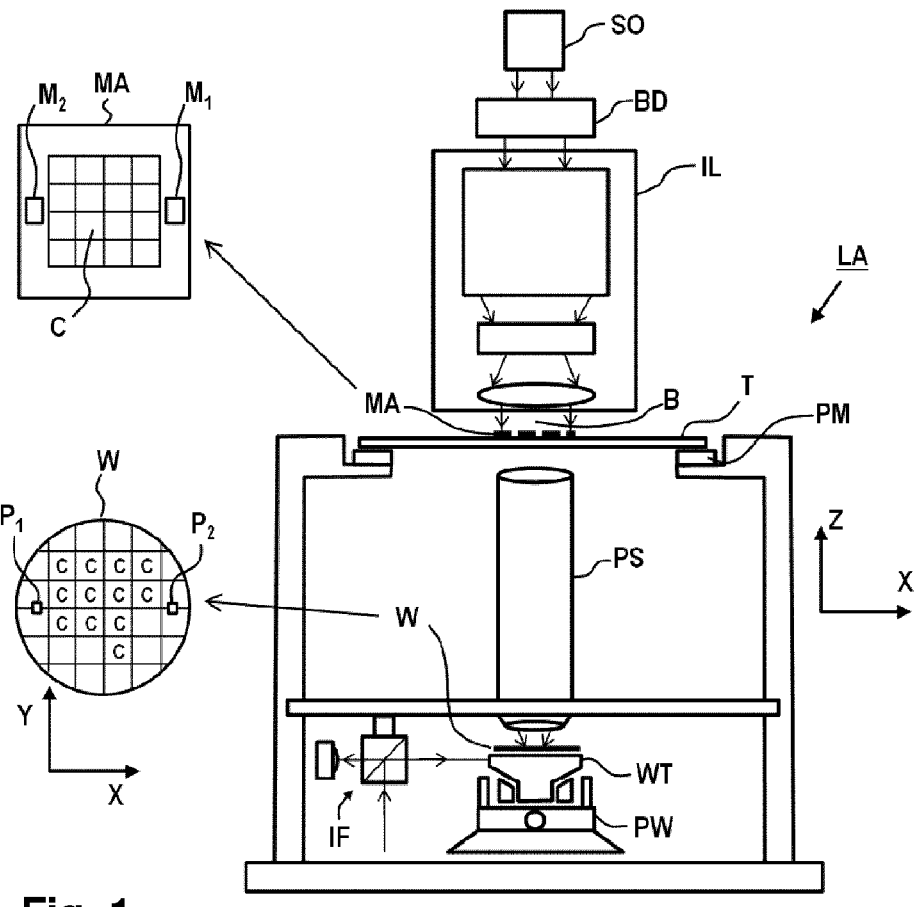
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
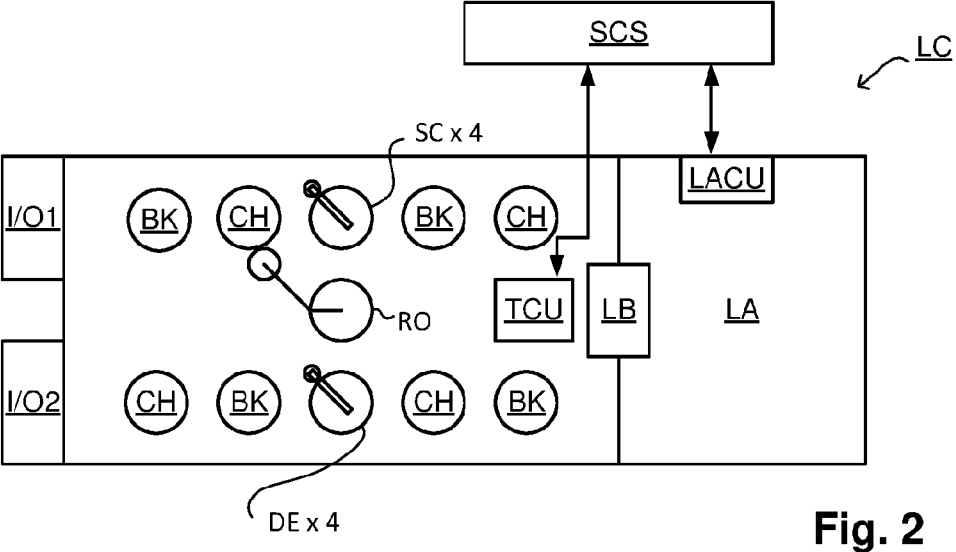
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
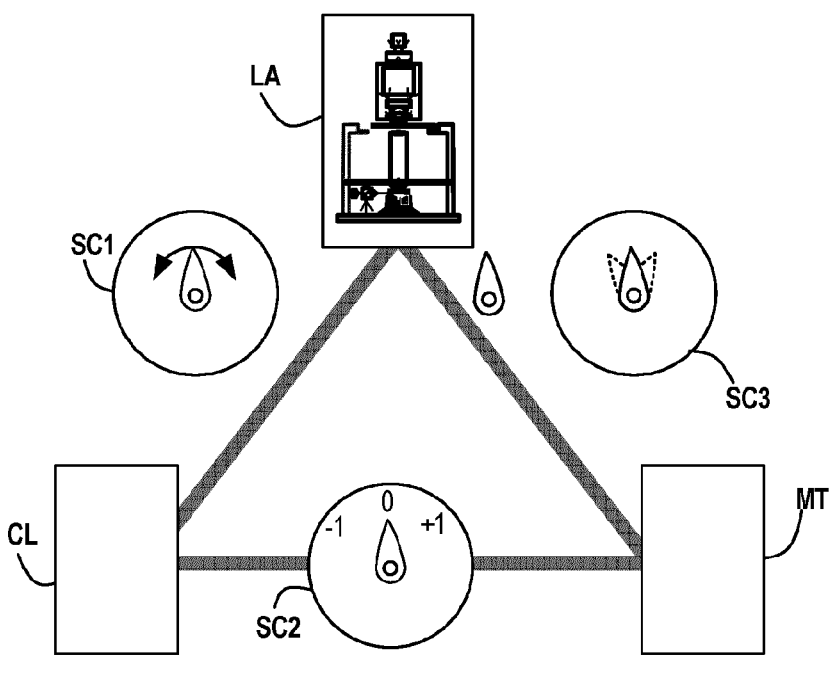
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/

012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
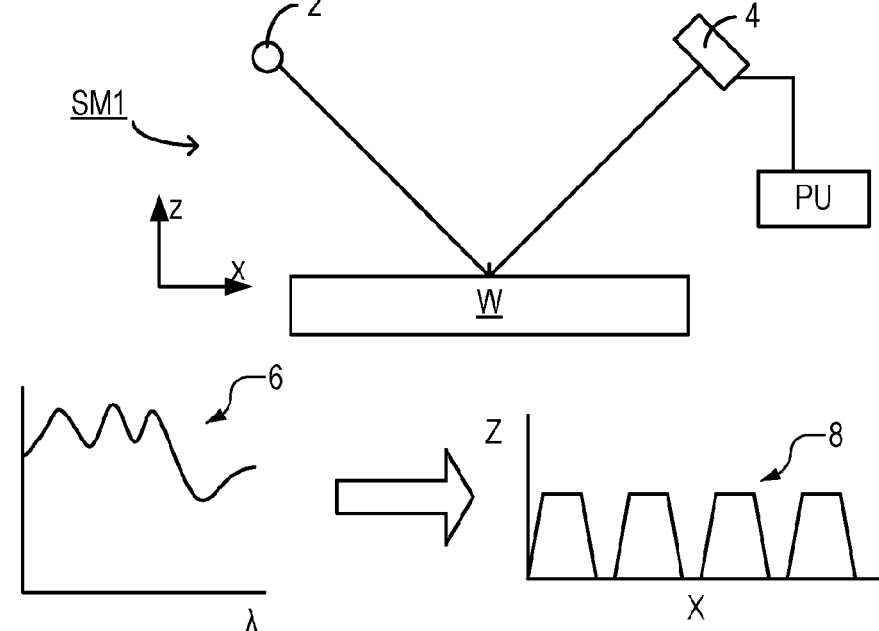
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (white light) radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016/0161863 and published US patent application US 2016/0370717A1 incorporated herein by reference in its entirety.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
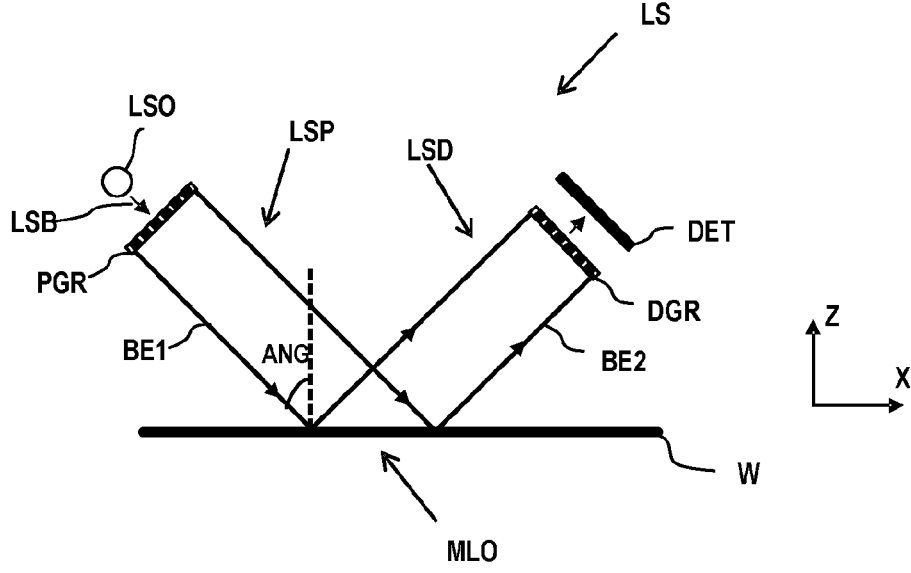
FIG. 5 depicts a schematic overview of a level sensor apparatus which may comprise a radiation source according to embodiments of the invention.

An example of a level or height sensor LS as known in the art is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband light source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 6:
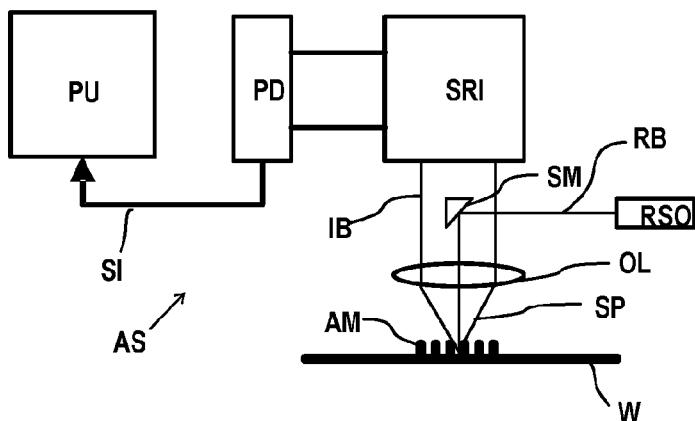
FIG. 6 depicts a schematic overview of an alignment sensor apparatus which may comprise a radiation source according to embodiments of the invention.

FIG. 6 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Metrology tools MT, such as a scatterometer, topography measurement system, or position measurement system mentioned above, as well as many other optical inspection tools may use a positioner or stage module for precisely and accurately positioning a sample (e.g., a semiconductor substrate or wafer) with respect to an optical beam. Depending on applications, the positioner may be configured to enable movement with multiple degrees of freedom (e.g., six degrees of freedom). Driven by the growing demand of manufacturing modern integrated circuits with ever shrinking sizes, metrology and inspection tools that can offer higher resolution and better reliability are under a fast-paced and extensive development. In many existing metrology and inspection tools, optical resolution is enhanced by using a high NA objective lens. For example, in existing scatterometer metrology tools for overlay measurement, an objective lens having a high NA (e.g., between 0.7 and 0.97) is often used. Where measurements are conducted on an image of the sample, simply using an objective lens with a high resolving power may not necessarily guarantee a high measurement accuracy. This is because in those cases measurement accuracy also relies on quality of acquired images. Any distorted or blurry image would significantly lower measurement accuracy.

As described in the Background section, in order to avoid generation of distorted or blurry images, a positioner carrying a sample (e.g., a substrate or wafer) should be completely or substantially stationary before image acquisition can start. The time needed to transition between a fast moving state and a stationary state accounts for a significant part of the MAM time. A large amount of such transitioning time is spent on deceleration and acceleration of e.g., a heavy substrate support to ensure a completely or substantially stationary sample with respect to imaging optics of the tool (e.g., objective lens, image sensor) during image acquisition. Since the MAM time is inversely proportional to the throughput of a metrology or inspection tool, i.e., the number of samples processed per unit time, it is thus desirable to reduce the MAM in order to boost the throughput.

FIG. 7 shows two diagrams illustrating the moving speed of a sample as a function of time respectively for the cases where image acquisition is performed while the sample is completely stationary (FIG. 7(a)), and for the cases where image acquisition is performed while the sample is still in motion (FIG. 7(b)). It should be appreciated that FIG. 7(b) can also be used for illustrating the cases where image acquisition is performed while an optical component (e.g., objective) of an optical system is moving with respect to a stationary sample. With reference to FIG. 7(a), the MAM time in this particular case comprises a first duration of time $\Delta T1$ taken for moving a sample between two positions (e.g., a current position and a next position), and a second duration of time $\Delta T2$ taken for acquiring an image. The first duration of time ΔT1 is defined as the duration between the time a positioner starts to move from the current position and the time the positioner settles completely (or the speed is zero) in the next position. With reference to FIG. 7(b), the MAM time comprises a first duration of time ΔT1' taken for moving a sample between two imaging areas and a second duration of time ΔT2' taken for acquiring an image. However, due to the nature of non-stationary sample, the first duration of time T1' is defined as the duration between the time a positioner leaves a current imaging area (at a certain non-zero speed) and the time enters a next imaging area (at a certain non-zero speed). In comparison to the top diagram, the movement time ΔT1' in the bottom diagram is reduced as the sample is allowed to be imaged while it is still in motion with a non-zero speed. Assuming acquisition time is constant (using the same image sensor), i.e. ΔT2=ΔT2', the reduction in the MAM time achievable by imaging a non-stationary sample is therefore the difference between the two transitioning periods, i.e. ΔT1 and ΔT1'.

Taking an image on a non-stationary sample or with a non-stationary image sensor often results in degraded image quality (e.g., blurry images). Various techniques have been developed and adopted in existing optical systems for motion compensation and image enhancement. For example, optical pick-up units are typically used in Digital Video Disc (DVD) and Blu-ray drives in laptops. Those optical pick-up units use very compact voice-coil motors (VCM) in combination with wire springs to accurately control radial, focus and tilt movements of a high NA objective lens (e.g., NA=0.85 for Blu-ray).

Optical image stabilization (OIS) techniques have been employed in many digital single-lens reflex (DSLR) cameras where a mechanical X-Y voice-coil actuator is used to control a separate, movable lens element or lens group, and/or an image sensor (e.g., a complementary metal-oxide-semiconductor (CMOS) sensor). The voice-coil actuator can be controlled using input from e.g., an acceleration sensor. Using the OIS techniques, DSLR cameras allow for 3-4 stops (equivalent to 8 to 16 times) of longer hand-held exposure times. In mobile electronic devices such as smart-phones, OIS based modules comprising highly miniaturized actuators are also used for motion compensation and auto-focus (AF). For example, the US patent U.S. Pat. No. 9,134,503B2 discloses a miniaturized lens actuator module developed for use in Apple iPhone cameras. The disclosed lens actuator module comprises an AF mechanism capable of moving a lens for focus optimization and an OIS mechanism capable of moving the lens for image stabilization Similar to OIS in DSLM cameras, this OIS mechanism is based on the voice-coil motor (VCM) technology.

Existing VCM based OIS techniques are limited to compensation of low-amplitude passive vibrations (e.g., hand-shake vibrations) of a hand-held optical imaging device (e.g., camera) and thus are not capable of compensating any active movement of a stage module that is purposely implemented e.g., in a scatterometer metrology tool by following a predefined wafer sampling strategy. High-speed and high-accuracy positioners could be used to further reduce the MAM time and hence improve the throughput. For many metrology applications such as overlay metrology, it is desirable that a high-speed positioner can provide a positioning accuracy of, for example, better than 1 micrometer. However, high-speed positioning requires high-speed control electronics and high-accuracy positioning requires high precision actuators. Fulfilling such stringent requirements results in positioners becoming too expensive and bulky.

In this disclosure, methods and apparatuses are proposed to reduce the MAM time and hence to increase the throughput of a metrology or inspection tool in a more cost-effective manner. For the sake of readability often only metrology is mentioned. However, metrology, inspection tool and something similar are meant. The proposed methods significantly reduce the MAM time by enabling good quality images to be acquired while a positioner (and thus a sample) is still in motion, i.e., a sample is not stationary with respect to imaging optics of a tool (e.g., objective lens, image sensor) during image acquisition. The proposed methods and concepts are embodied in the various example metrology tools illustrated in FIGS. 8 to 11. Note that for the sake of simplicity, all the figures comprise simplified schematics which show only some components, e.g., those sufficient for the purpose of describing the working principle of the proposed methods.

The embodiments may comprise a motion compensatory mechanism having a dynamic mounting for a component of the optical imaging system and actuator to actuate a compensatory movement of the component.

FIG. 8 schematically illustrates an embodiment of an optical imaging system or scatterometer metrology tool where a high NA objective lens is used for motion compensation. As illustrated in FIG. 8, an illumination beam of radiation IB may be reflected into an objective lens OB by a turning mirror TM. The illumination beam IB may comprise a beam diameter that is smaller than the pupil diameter of the objective lens OB and may pass through the center of the objective lens OB. The illumination beam IB may be subsequently focused onto a target OT of a substrate WA. The focused illumination beam IB may comprise a spot diameter that is inversely proportional to the NA of the objective lens OB.

The substrate WA may be supported and positioned by a stage module SM which may comprise a substrate support (not shown) for holding the substrate WA. The (e.g., grating based overlay) target OT may diffract the illumination beam IB into a number of diffraction orders. In the case where the tool is configured for dark field imaging, the zeroth diffraction order may be blocked by an optical component (not shown). In this embodiment, two non-zeroth diffraction orders, e.g., positive first diffraction order DB1 and negative first diffraction order DB2, may be collected by the objective lens OB. In other embodiments, only one non-zeroth diffraction order (e.g., positive first diffraction order DB1) may be collected by the objective lens OB. The objective lens OB may be configured to comprise a high NA, which may be greater than 0.7, greater than 0.8 or greater than 0.9, for example: in the range between 0.7 and 0.97, or between 0.9 and 0.95. A high NA objective lens OB not only improves optical resolution but also helps avoid spatial overlapping between the diffracted beams DB1, DB2 (or more generally signal beams) and the illumination beam IB in the pupil plane of the objective lens OB, which is highly desired for obtaining good image quality. In different embodiments (as described below), illumination and detection may be separate using one or more objective lenses with lower NA.

In the non-limiting embodiment of FIG. 8, the objective lens OB may comprise two lens elements or lens groups, i.e. a first lens element or lens group OE1 and a second lens element or lens group OE2. At least one of the two lens elements or lens groups OE1, OE2 may be configured to be moveable within the external casing of the objective lens OB. In this embodiment, such movement may be limited in a plane (e.g., x-y plane) substantially perpendicular to the optical axis of the objective lens OB. In other embodiments, the lens elements or lens groups OE1 may be additionally configured to move along the optical axis of the objective lens OB such that fine optimization of the focusing of the objective lens OB may be achievable. In other embodiments, the objective lens OB may comprise any number (e.g., single or multiple) of lens elements or lens groups.

An image lens IL may be used to focus the diffracted beams DB1, DB2, onto an image sensor IS such that an image IM of the target OT is formed. In addition, one or more optical elements (not shown) may be used e.g., to shape and/or direct the diffracted beams DB1, DB2 at the pupil plane of the objective lens OB. The one or more optical elements may comprise for example one or more optical wedges for directing the diffracted beams to desired locations on the image sensor IS, or one or more optical filters for selectively transmit desired wavelengths. In different embodiments, there may be no image lens IL and/or other optical elements.

The stage module SM may comprise one or more actuators (e.g., electromagnetic actuators) and may allow for movement with multiple (e.g., six) degrees of freedom. In the embodiment of FIG. 8, the objective lens OB unit and the image sensor IM may be fixed in position. In order to evaluate a parameter of interest (e.g., overlay error of a new process layer), measurements may be made over various targets OT that are distributed across the substrate WA. The stage module SM may be configured to move the substrate WA between targets OT by following a predefined sampling scheme. The stage module SM may move in a plane substantially parallel to the x-y plane (according to the coordinate system in FIG. 8). Note that, the proposed motion compensation methods are not limited only for imaging a moving target/object. They are applicable so long as there is relative motion between the target and the objective lens OB unit during image acquisition. For example, in different configurations, the scatterometer metrology tool 800 may comprise a stationary stage that supports the substrate WA in a fixed position and a movable objective lens OB unit that is configured to direct the illumination beam IB to different parts of the substrate WA. In other configurations, the whole imaging section (comprising e.g., the objective lens OB unit, the illumination lens IL, and the image sensor IM) of the scatterometer metrology tool 800 may be moveable with respect to a stationary sample. In all these cases, the proposed motion compensation methods can be used to improve image quality and throughput.

Referring back to FIG. 7(*b*), during an image acquisition period $\Delta T2'$, the stage module SM may first decelerate from an intermediate speed $V_I$ to a predefined minimum speed $V_{min}$ and, immediately when the minimum speed $V_{min}$ is reached or shortly thereafter, recommence acceleration. In other embodiments, the stage module SM may maintain the minimum speed $V_{min}$ for a short period of time before starting to accelerate again. Subsequently, the stage module SM may continue to accelerate until a predefined maximum speed $V_{max}$ is reached. The stage module SM may then move at the maximum speed for a period of time e.g., as determined by the distance between the current target OT and the next target OT. When the next target OT is nearing the focused illumination beam IB, the stage module SM may start to decelerate from the maximum speed $V_{max}$ towards the minimum speed $V_{min}$. At the intermediate speed $V_I$, the stage module SM may have entered an imaging zone where the focused illumination beam IB can measure the next target OT. At this point of time, a further image acquisition can be performed which takes the same amount of time $\Delta T2'$ as the previous image acquisition. The stage module SM may again begin to accelerate before the image acquisition is finished, e.g., such that the intermediate speed $V_I$ is reached at around the time the capture is completed. Note that, the above-mentioned minimum speed, intermediate speed and maximum speed can be determined according to the configuration of a metrology tool as well as application needs.

A moving target OT during image acquisition may cause the diffracted beams DB1, DB2 to shift with respect to the image sensor IS and therefore result in a spatial-shifting image on the image sensor IS. During an image exposure, such a spatial-shifting image may result in a global 'motion blurring' artefact in the direction of motion, which will lower the accuracy of the computed parameter of interest values without further measures. To address this problem, it is proposed to provide a motion compensatory mechanism which is able to compensate for the motion induced the beam shifting and thus maintain the image position on the image sensor IS.

In the embodiment of FIG. 8, the objective lens OB may be configured such that the first lens element or lens group OE1 is translatable with respect to the second lens elements or lens groups OE2 or vice versa. For example, the first lens element or lens group OE1 may be translated in a plane substantially perpendicular to the optical axis of the objective lens OB, e.g., the x-y plane according to the coordinate system in FIG. 8. The translation of the first lens element or lens group OE1 may be actuated using at least one actuator. The at least one actuator may be located within the external casing of the objective lens OB. The at least one actuator may comprise for example at least one miniaturized voice-coil actuator, or at least one miniaturized electromagnetic actuator.

The translation of the first lens element or lens group OE1 may achieve one or both of: 1) shifting the illumination beam IB such that it always illuminates the same area of the moving target OT; and 2) compensating for the spatial shifting of the diffracted beams DB1, DB2 in the pupil plane of the objective lens resulting from the moving of the target OT.

FIGS. 9(*a*) and 9(*b*) respectively illustrates operating principle of motion compensation implemented in the first configuration of the scatterometer metrology tool in accordance with an embodiment. For the sake of simplicity, the stage module SM in FIGS. 9(*a*) and 9(*b*) are only shown moving in +x direction. In reality, the stage module SM may move in any direction within the x-y plane (according to the coordinate system in FIG. 8). An image acquisition may start at the first time instance T1 and finish at the second time instance T2. During the acquisition period, i.e. between the two time instances T1 and T2, the target OT may have moved by a distance of $\Delta x$ along the +x direction.

As mentioned above, without any motion compensation measures, the acquired image IM will show motion blurring artefact resulting from relative movement between the illumination beam IB and the moving target OT. So by translating the first lens element or lens group OE1 along the same direction, i.e. +x direction, it is possible to ensure the illumination beam IB moves together with the overlay target OT in a substantially synchronized manner such that the illumination beam IB always illuminates the same area or substantially the same area of the target OT at least during the image acquisition period. The distance +$\Delta x'$ that the first lens element or lens group OE1 is required to move in order to sufficiently compensate motion (or to closely follow the target OT) may depend on the specific design of the objective lens OB. At the second time instance T2, since the second lens element or lens group is fixed in position, the shifting of the first lens element or lens group OE1 may result in the illumination beam IB being obliquely incident on the overlay target OT. Oblique incidence of the illumination beam IB may in turn result in the diffracted beams DB1, DB2 propagating along different optical paths before being collected by the objective lens OB. While transmitting through the lens elements or lens groups OE1, OE2 within the objective lens OB, the spatial shifting of the diffracted beams may be substantially compensated by the lateral shifting of the first lens element or lens group OE1.

The overall effect of translating the first lens element or lens group OE1 may be such that upon leaving the objective lens OB, the diffracted beams DB1, DB2 may follow substantially the same optical paths that lead to substantially the same position on the image sensor IS at least during each image acquisition period. In other words, the image IM formed on the image sensor may stay substantially the same position and have substantially the same sharpness even when an image is taken from a moving target OT.

The scatterometer metrology tool 800 may comprise a control unit CU configured to control some or all of the moveable parts or components in the tool. The control unit CU may comprise one or more sub control units (not shown), each being configured to control one component in the tool. In the embodiment of FIG. 8, the control unit CU may comprise a first sub control unit configured for controlling the actuators of the stage module SM, a second sub control unit configured for controlling the actuators of the objective lens OB, and a third sub control unit configured for controlling the image sensor IS for image acquisition. In other embodiments, the control unit CU may comprise one or more sub control units which may be respectively configured for different control tasks. The control unit CU may be a computer system and may comprise at least one processor and one memory.

In the cases where a wafer or a sample is measured or inspected by following a predefined sampling strategy/scheme, the control unit CU may receive the information detailed in the sampling scheme that is to be executed. Such sampling details may comprise for example the distribution of the targets OT that are selected for measurement, the sampling order of each selected target OT (or the target motion trajectory of the stage module SM), the maximum and minimum speeds of the stage module SM, the acceleration and deceleration rates of the stage module SM. The sampling details may provide the control unit CU with the time-dependent movement vector of the stage module SM. The control unit CU may further input the predefined sampling details to a prediction model, which may be stored in the memory of the control unit CU and may be configured to predict the dynamic behavior of the stage module SM during the next moving operation, in particular the dynamic behavior during the image acquisition period (e.g., ΔT2/ΔT2' in FIG. 7). Having the knowledge of the time-dependent movement vector and predicted dynamic behavior of the stage module SM, the control unit CU may be able to real-time track the damped oscillatory settle behavior of the stage module SM using feedforward control. The control unit may be able to control the movement of the first lens element or lens group OE1 in such a way that it moves substantially synchronously with the stage module SM at least during each image acquisition period. In some embodiments, additional sensors may be used to measure for example real-time position and moving parameters (e.g., speed, acceleration, etc.) of the stage module SM such that more accurate and robust motion compensation can be obtained.

Referring back to FIGS. 9(*a*) and 9(*b*), when a new target OT is entering the imaging zone, which may be defined as the region between a first stage position at the first time instance T1 and a second stage position at the second time instance T2, the control unit CU may command the actuators to move/translate the first lens element or lens group OE1 in a synchronized manner. The moving characteristics of the first lens element or lens group OE1, such as for example moving speed, acceleration and deceleration rates, moving distance, may be determined based on, for example, the programmed movement vector, the predicted dynamic behavior of the stage module SM, as well as the design of the objective lens OB (and the dynamic behavior of first lens element or lens group OE1). The design of the objective lens OB may determine a motion factor that defines the relationship between the moving characteristics of the stage module SM and those of the first lens element or lens group OE1.

Once an image acquisition is complete, the control unit CU may configure the actuators of the stage module SM for the next moving operation according to the sampling scheme. The control unit may command the actuators to move the stage module SM to the next predefined position such that a next target OT can be measured/imaged. In the meantime, the control unit CU may also configure the actuators of the first lens element or lens group OE1 for the next predefined moving operation according to the programmed movement vector, the predicted dynamic behavior of the stage module SM and the aforementioned motion factor. The first lens element or lens group OE1 will be translated or moved when the next target OT enters the imaging zone.

The forgoing embodiments are described in an example configuration where a high NA objective lens is employed for both illumination and detection; however, it should be appreciated that the proposed methods are equally applicable for other configurations where one or more lower NA objective lenses are used (e.g., the objective lens may be used only for detection with a separate lens or illumination beam delivery system used in the illumination branch).

FIG. 10 schematically illustrates an embodiment of an optical imaging system or the scatterometer metrology tool where a low NA objective lens is used for motion compensation. In the embodiment of FIG. 10, the low NA objective lens OB may comprise at least one lens element or lens group configured to be translatable and may be used solely for detection.

With reference to FIG. 10, an illumination rotating mirror IRM may be used in the embodiment to direct a (focused) illumination beam of radiation IB towards a substrate WA. The illumination beam IB may be obliquely incident on a target OT of the substrate WA. The illumination beam IB may be focused by a second low NA objective lens (now shown) located before the illumination rotating mirror IRM. Upon interacting with the target OT, the illumination beam IB may be diffracted into multiple diffraction orders, among which two first diffraction orders DB1, DB2 (corresponding respectively to $+1^{st}$ diffraction order and $-1^{st}$ diffraction order) may be collected by an objective lens OB'. The objective lens OB' may comprise a low NA which may be in the range between 0.2 and 0.7, or between 0.3 and 0.7 or between 0.3 and 0.5. The low NA objective lens OB' may be configured in a similar manner as the high NA objective lens OB in FIGS. 8, 9(*a*) and 9(*b*). The objective lens OB' may comprise two lens elements or lens groups, i.e. a first lens element or lens group OE1' and a second lens element or lens group OE2', at least one of which may be configured to be translatable or movable by means of at least one actuator.

In contrast to the embodiment of FIG. 8, where the translation of the first lens element or lens group OE1 enables the illumination beam IB to illuminate substantially the same area of the overlay target and the diffracted beams DB1, DB2 to follow substantially the same optical paths to the image sensor, the movement of the illumination beam TB and the movement of the collected diffracted beams DB1, DB2 in the embodiment of FIG. 10 may be no longer coupled together. Instead, the movement of the illumination beam IB on the target OT may be achieved separately through e.g., pitch rotation PR and yaw rotation YR of the illumination rotating mirror IRM. In this example, the translation of the first lens element or lens group OE1' may be used for compensation of only the shifting of the collected diffracted beams DB1, DB2 to ensure a substantially stationary image IM on the image sensor IS at least during each image acquisition period. The spatial shifting of the diffracted beams DB1, DB2 may be resultant from the movement of the illumination beam IB which changes the incidence angle of the illumination beam IB with respect to the target OT and thus the propagation directions of the diffracted beams DB1, DB2. The rotation of the illumination rotating mirror IRM may control the illumination beam IB to closely follow the moving target OT such that the illumination beam IB illuminates substantially the same area of the overlay target OT at least during each image acquisition period. The translation of the first lens element or lens group OE', the rotation of the illumination rotating mirror IRM, the movement of the stage module SM and the image acquisition of the image sensor IS may all be controlled by a control unit CU'.

In the embodiment of FIG. 10, the control unit CU' may function in a similar manner as that in the embodiment of FIG. 8. The control unit CU' may also comprise one or more sub control units, each being configured to control one component in the tool. For example, the control unit CU' may comprise a first sub control unit configured for controlling the actuators of the stage module SM, a second sub control unit configured for controlling the actuators of the objective lens OB, a third sub control unit configured for controlling the image sensor IS for image acquisition, and a fourth sub control unit configured for controlling the rotation of the illumination rotating mirror IRM. In other embodiments, the control unit CU' may comprise one or more sub control units which may be respectively configured for different control tasks. The control unit CU' may comprise at least one processor and one memory.

In the cases where a wafer or a sample is measured or inspected by following a predefined sampling strategy/scheme, the control unit CU' in FIG. 10 may also receive the information detailed in the sampling scheme that is to be executed. The control unit CU' may further input the predefined sampling details to a suitable prediction model to predict the dynamic behavior of the stage module SM during the next moving operation. Having the knowledge of the programmed movement vector for, and dynamic behavior of, the stage module SM, the control unit may be able to control the movement of the illumination rotating mirror IRM and the first lens element or lens group OE1 in such a way that both are controlled substantially synchronously with the stage module SM.

Note that the illumination delivery method of this embodiment (e.g., illumination rotating mirror IRM) is only an example and other controllable illumination delivery methods and arrangements may be employed which are controllable synchronously with the stage module SM and objective lens OB' or an element thereof.

In different embodiments, rather than by translating at least one lens element or lens group in the objective lens OB, OB', the spatial shifting of the diffracted beams DB1, DB2 may be compensated by translating the whole objective lens OB, OB'. Each of the high NA configuration (e.g., the embodiment of FIG. 8) and the low NA configuration (e.g., the embodiment of FIG. 10) may be adapted to synchronously move the whole objective lens OB, OB' for imaging a nonstationary/moving microscopic object, rather than only an element thereof. For both high NA and low NA configurations, the translation of the whole objective lens OB, OB' may be enabled by actuation of the objective lens by at least one actuator (e.g., voice-coil actuators, electromagnetic actuators), e.g., under control of the control unit CU, CU'. The translation of the whole objective lens OB, OB' may result in substantially the same effect in terms of e.g., image quality and throughput as the translation of at least one lens element or lens group.

In case of a high NA configuration where the illumination and detection are coupled and both enabled by a single high NA objective lens OB, the synchronous translation of the whole objective lens OB may allow the illumination beam IB to closely follow the moving target OT such that the illumination beam IB illuminates substantially the same area of the moving target OT at least during each image acquisition period. In the meantime, the synchronous translation of the whole objective lens OB may also compensate for the spatial shifting of the collected diffracted beams DB1, DB2 such that upon leaving the objective lens OB, the diffracted beams DB1, DB2 may follow substantially the same beam paths leading to the substantially the same image position on the image sensor IS at least during each image acquisition period.

In case of a low NA configuration where the illumination and detection are decoupled, the synchronous translation of the whole objective lens OB may function to ensure only the diffracted beams DB1, DB2 follow substantially the same beam paths leading to the substantially the same image position on the image sensor IS at least during each image acquisition period. A separate mechanism (e.g., the illumination rotating mirror IRM in FIG. 10) may be employed to synchronously move the illumination beam IB such that the illumination beam IB illuminates substantially the same area of the moving target OT at least during each image acquisition period.

Rather than translating either the lens element or lens group of the objective lens OB' or translating the whole objective lens OB', the spatial shifting of the diffracted beams DB1, DB2 may be compensated by translating or moving at least one optical component located between the objective lens OB' and the image sensor IS. In some embodiments in the low NA configuration, the at least one optical component may comprise for example the image lens IL in FIG. 10. The translation of the image lens IL may result in a substantially stationary image IM on the image sensor IS at least during each image acquisition period. In some other embodiments in the low NA configuration, the spatial shifting of the diffracted beams DB1, DB2 may be not actively compensated. Instead, the image sensor IS may be configured to be translatable such that the image sensor IS closely follows the moving image IM resulting from the shifting of the diffracted beams DB1, DB2 at least during each image acquisition period. In both these examples, the illumination beam IB may be configured to closely follow the moving target OT e.g., by means of an illumination rotating mirror IRM as employed in the embodiment of FIG. 10 or otherwise. In some embodiments, two, more or all of the optical components in the detection branch of the scatterometer metrology tool 1000 (e.g., comprising the objective lens OB, the image lens IL and the image sensor IS in FIG. 10) may be moveable for motion compensation when imaging a nonstationary target or (microscopic) sample.

Figures 11, 12:
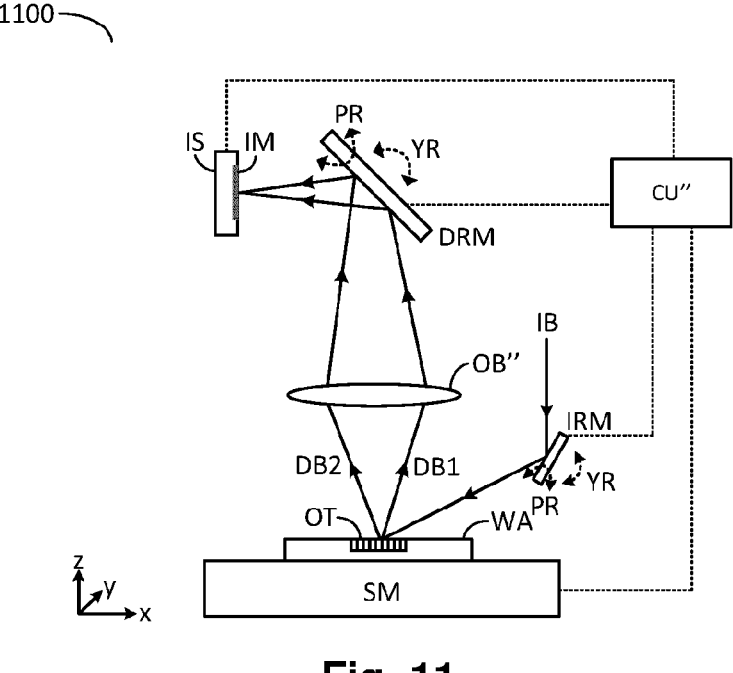
FIG. 11 depicts schematically an embodiment of the scatterometer metrology tool in a third configuration.
FIG. 12 is a block diagram illustrating training of CNN to predict corrected images from blurred images and from the known blurring kernel.

FIG. 11 schematically illustrates an embodiment of an optical imaging system or scatterometer metrology tool where an illumination rotating mirror and a detection rotating mirror are used for motion compensation. Different to the embodiment of FIG. 10, the detection branch of the embodiment of FIG. 11 may be folded by a detection rotating mirror DRM. In the scatterometer metrology tool 1100, upon leaving the objective lens OB", the diffracted beams DB1, DB2 may be reflected onto the image sensor IS via the detection rotating mirror DRM. In some embodiments in the third configuration, an image lens IL may be additionally placed in-between the image sensor IS and the objective lens OB" to better control the image size on the image sensor IS. In this embodiment, the illumination beam IB may be controlled and moved in the same way as in the embodiment of FIG. 10. The synchronous movement of the illumination beam IB may ensure the illumination beam IB illuminates substantially the same area of the target OT.

The movement of the illumination beam IB may inevitably change the incidence angle of the illumination beam IB with respect to the target OT and consequently change the propagation directions of the diffracted beams DB1, DB2. Once collected by the objective lens OB", the diffracted beams DB1, DB2 may follow different optical paths that lead to a different image position on the image sensor IS. In order to compensate for such an image shift so as to maintain a substantially stationary image IM on the image sensor IS during at least each image acquisition period, the detection rotating mirror DRM may be configured to rotate e.g., in both pitch PR and yaw YR directions. Similar to the operation of the illumination rotating mirror IRM, the rotation of the detection rotating mirror DRM may also be in synchronization with the movement of the target OT. Such synchronization may be controlled based on a predefined sampling scheme and predicted dynamic behavior of the stage module SM, as described above. In this way, the image shift resulting from the diffracted beams DB1, DB2 propagating along different optical paths may be actively compensated by the rotation of the detection rotating mirror DRM. As a result, the image IM may be controlled substantially stationary on the image sensor at least during each image acquisition period. The movement of the illumination rotating mirror IRM, the detection rotating mirror DRM, the stage module SM and the image sensor IS may all be controlled by the control unit CU".

As an alternative to using a detection rotating mirror DRM in an arrangement such as illustrated in FIG. 11, a digital micromirror device (DMD) device may be used to apply a phase ramp to the diffracted beams. A disadvantage of using a DMD is that the frame rate is low and the light loss associated with the use of Lee holograms. The angular deviation obtained from a DMD can be in the range of 4-5 degrees but the required image displacement can be obtained by increasing the distance to the sensor. An advantage of using a DMD device is that aberrations can be corrected for at the same time as image stabilization. As the target moves under the lens, the field dependent aberrations can change.

This means the target looks different for different field positions. Using a DMD, these changing aberrations can be compensated for adaptively.

Implementation of non-stop metrology using a Digital micro mirror device.

In some embodiments, an image processing algorithm may be additionally applied to further compensate for any image blurring artefact before computing a parameter of interest value, thereby substantially maintaining the original accuracy of the overlay value while increasing the throughput. The working principle of the image processing algorithm may be described by following equation:

$$J(x,y)=I(x,y)*h(x,y)+n(x,y), \qquad \text{Eq. (1)}$$

where the I(x,y) denotes the value of an image pixel at coordinate (x,y); h(x,y) denotes the motion blur kernel which is the result of the optical point spread function and the motion trajectory of the stage module SM during image acquisition; n(x,y) denotes the sum of all noise contributions on the image which may comprise for example Poisson shot noise, dark noise, quantization noise from analog-to-digital conversion.

The total blur kernel h(x,y) may be computed from an earlier-measured optical point spread function of the imaging system, e.g., the scatterometer metrology tool 800, 1000, 1100, in combination with the known target motion trajectory belonging to an observed image with motion blur. The image processing algorithm may be configured to correct for the motion-part of the blur kernel as well as the non-ideal optical point spread. Once the total blur kernel h(x,y) is determined, the original un-blurred image $\hat{I}(x,y) \approx I(x,y)$ may be estimated from an observed motion-blurred image (x,) and knowledge of the motion blur kernel h(x,y). The estimation may be achieved by using one of existing image restoration approaches such as for example Wiener filtering, image deconvolution, constrained least-squares, and other iterative methods. Note that the restored image $\hat{I}(x,y)$ may contain high-frequency noise which stems from the inversion of the (low-pass) blurring kernel h(x,y). To reduce the influence of such high-frequency noise, it is desirable that signal extraction may involve taking the average value of a region-of interest.

The image processing algorithm may be configured to adopt a data driven methodology and to use a deep convolutional neural network (CNN) as such a network is well-suited for recognizing patterns and processing images. One approach may be to let the deep CNN produce a de-blurred image from an observed blurred input plus known blur kernel and then perform further processing on a region of interest to compute overlay values for e.g., x and y. Another approach is to let the CNN compute the overlay values for e.g., x and y directly from the same inputs.

According to the first approach, with reference to FIG. 12, for network training a large number of example clean "ground truth' images I(x,y) is used where for each example the image is obtained from a conventional measurement with zero-motion during exposure. Then, for each example image I(x,y) a motion-blurred version J(x,y) is computed using a signal model as in Eq 1, or alternatively, actual blurred images area measured for different speed profiles. The advantage of using computed images is that a large dataset can be created easily which is beneficial for network training. For the computed images, noise may be included based on a realistic camera noise model which includes camera shot noise, camera dark noise, analog electronics noise, and quantization noise from analog-to-digital conversion. Per input example, many different randomized motion blur kernels can be applied to cover all relevant use cases. The blurred (and noisy) image may be input to a CNN, where the CNN may have as many inputs as there are pixels, where the CNN may have one or multiple hidden layers, and where the CNN has an output layer which outputs the estimated corrected image I'(x,y).

Figures 13, 14, 15, 16:
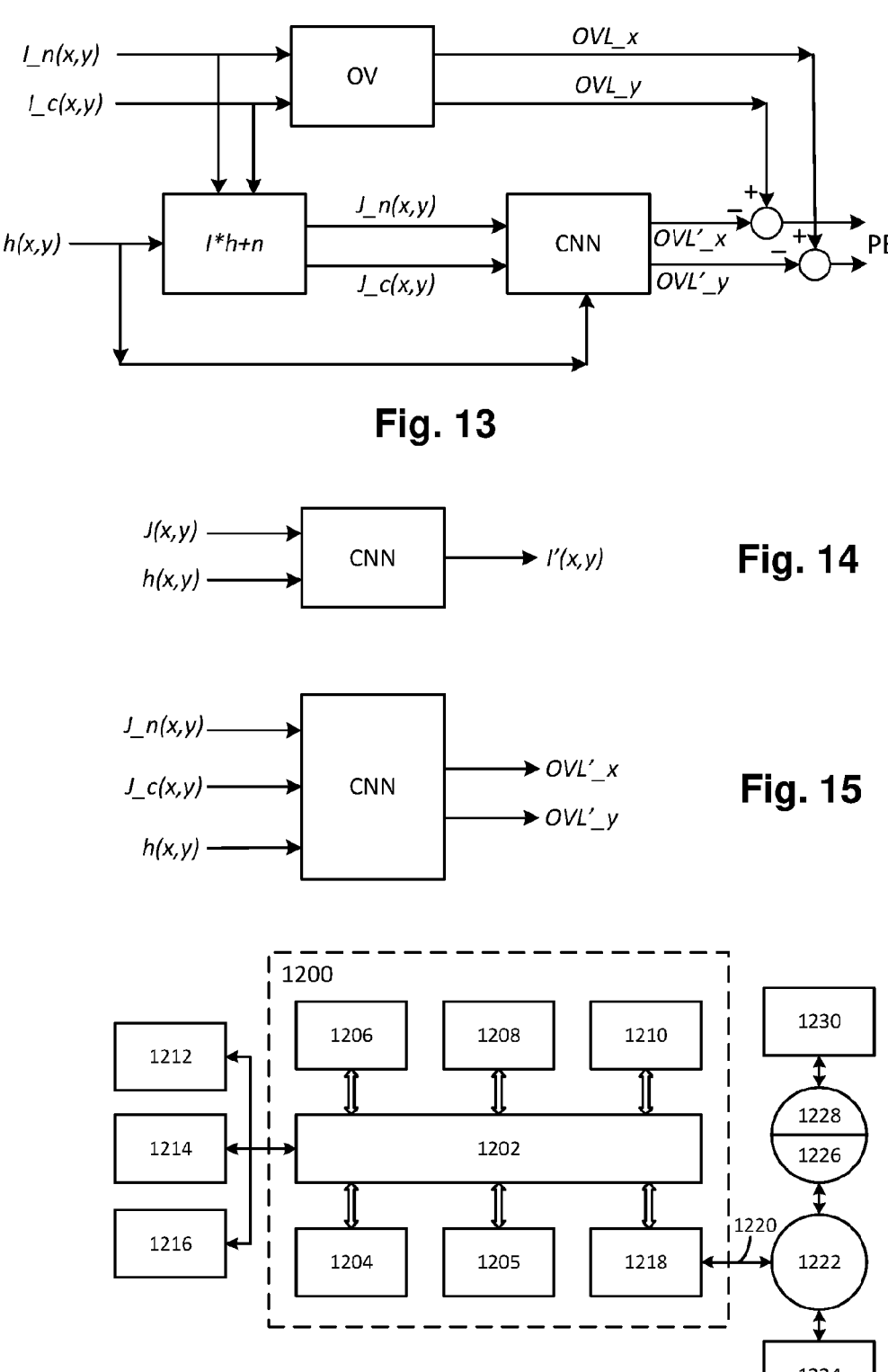
FIG. 13 is a block diagram illustrating training of a CNN to predict overlay values for x and y directly from blurred images and from the known blurring kernel.
FIG. 14 is a block diagram illustrating an inference of a trained CNN predicting an unblurred image from a motion-blurred input image plus motion blur kernel.
FIG. 15 is a block diagram illustrating an inference of a trained CNN predicts overlay for x and y directly from a motion-blurred input image pair plus motion blur kernel.
FIG. 16 depicts a block diagram of a computer system for controlling a broadband radiation source.

Alternatively, according to the second approach, the CNN may have an output layer which outputs the predicted overlay values OVL'_x, OVL'_y, as shown in FIG. 13. The predicted overlay values OVL'_x, OVL'_y may be compared to the actual overlay values OVL_x, OVL_y to obtain prediction error PE. The actual overlay values may be computed based on a normal image I_n(x,y) and a complementary image I_c(x,y). The motion blurred versions J_n (x,y), I_c(x,y) of both normal and complementary images are computed using the signal model as in Eq. 1 before being used in the CNN to predict overlay values OVL'_x, OVL'_y. Of course, the basic concept is applicable to other parameters of interest.

The motion blur kernel h(x,y) is also input to the CNN so that the neural network can learn the relationship between the motion of the wafer stage and the image blurring artefact, as shown in FIGS. 12 and 13. Training is done to minimize the prediction error PE, where one of many well-known training algorithms and error criteria can be taken.

The image processing algorithm may be configured such that motion blur kernel h(x,y) is replaced by a vector containing time samples of the measured stage velocity (both magnitude and direction) during image acquisition. Alternatively, the vector may contain time samples of the measured stage position (both x and y) during image acquisition. Alternatively, the CNN can operate in a so-called Generative-Adversarial-Network (GAN) mode. Here, the CNN will generate 'candidate' unblurred images, which are then blurred with the known kernel, and compared to the actual observed images. The network parameters are trained such that the candidate image with the best match with the observed is returned. The advantage of this mode is that the training does not require 'ground-truth' unblurred images.

For inference (that is execution on new image data) and according to the first approach, the trained convolutional neural network (CNN) is used as a predictor operating on a newly-acquired motion-blurred image J(x,y) and knowledge of the blurring kernel h(x,y) from knowledge of how the wafer stage was moved, to compute an estimated unblurred image I'(x,y), as shown in FIG. 14. This is done for both a normal and a complementary image. The resulting unblurred image pair can then be used by the signal extraction module to compute the parameter of interest.

Alternatively, for inference according to the second approach, the trained CNN is used as a predictor operating on a newly-acquired motion-blurred image J(x,y) and knowledge of the blurring kernel h(x,y) (e.g., obtained from knowledge of how the wafer stage was moved), to compute overlay values (OVL_x, OVL_y) or other parameter of interest for x and y directly, as shown in FIG. 15.

The image processing algorithm may also be configured to take a sequence of N images (instead of single image as described above) using an acquisition time which is N times smaller and use the N images in combination with the known stage motion trajectory to compute one average image where each of the N images have been motion-compensated before averaging. In this way a restored image is created (with little blur due to short exposure times) which can be used for further signal extraction for overlay/parameter of interest. The individual images out of the series of N will have a low quality in terms of noise (due to the very short exposure time), but the restored image will effectively have the noise level corresponding to the total integration time of the series. Moreover, if the frequency of the residual mechanical oscillations during acquire time is known, it is possible to take the N images such that they are in-phase with the oscillation, thereby making the effect of the oscillation more similar between the N images.

Further embodiments of the present systems and methods are disclosed in the subsequent list of numbered clauses:

1. An optical imaging system, comprising:
   a stage module configured to support an object such that an area of the object is illuminated by an illumination beam;
   an objective lens configured to collect at least one signal beam, the at least one signal beam originating from the illuminated area of the object;
   an image sensor configured to capture an image formed by the at least one signal beam collected by the objective lens; and
   a motion compensatory mechanism operable to compensate for relative motion of the stage module with respect to the objective lens during an image acquisition by causing a compensatory motion of one or more of:
   said objective lens or at least one optical element thereof;
   said image sensor; and/or
   an optical element comprised within a detection branch and/or illumination branch of the optical imaging system.

2. An optical imaging system as defined in clause 1, wherein said motion compensatory mechanism is operable such that, during the image acquisition, the image is maintained at substantially the same position on the image sensor despite any motion of the stage module during said image acquisition.

3. An optical imaging system as defined in clause 1 or 2, wherein the motion compensatory mechanism comprises:
   a dynamic mounting for the entire objective lens enabling said compensatory motion; and an actuator to actuate said compensatory motion.

4. An optical imaging system as defined in clause 1 or 2, wherein the motion compensatory mechanism comprises:
   a dynamic mounting for one or more optical elements within the objective lens enabling said compensatory motion; and
   an actuator to actuate said compensatory motion.

5. An optical imaging system as defined in clause 3 or 4, wherein the at least one actuator comprises one or more of: at least one voice-coil actuator, at least one balance spring, and/or at least one micro-electromechanical system (MEMS) structure.

6. An optical imaging system as defined in clause 1 or 2, wherein the motion compensatory mechanism comprises:
   a dynamic mounting for said image sensor enabling said compensatory motion; and
   an actuator to actuate said compensatory motion.

7. An optical imaging system as defined in clause 1 or 2, wherein the motion compensatory mechanism comprises:
   an optical element comprised within a detection branch and/or illumination branch and dynamic mounting therefor enabling said compensatory motion; and
   an actuator to actuate said compensatory motion.

8. An optical imaging system as defined clause 7, wherein the optical element comprises an image lens for imaging the image on the image sensor.

9. An optical imaging system as defined in clause 7, wherein the optical element comprises a detection dynamic mirror and actuator therefor or digital micromirror device enabling said compensatory motion by control of reflection of the at least one signal beam to the image sensor.

10. An optical system as defined in any of clauses 1 to 5, being configured such that the illumination beam illuminates said area of the object via said objective lens.

11. An optical system as defined in any of clauses 1 to 9, further comprising an illumination beam delivery system operable to controllably deliver said illumination beam to said object.

12. An optical imaging system as defined in clause 11, wherein said illumination beam delivery system comprises an illumination dynamic mirror configured to reflect the illumination beam to the area of the object such that the illumination beam moves substantially synchronously with the stage motion so as to illuminate substantially the same area of the object during image acquisition.

13. An optical imaging system as defined in any preceding clause, further comprising a control unit configured to determine said compensatory motion for said motion compensatory mechanism.

14. An optical imaging system as defined in clause 13, wherein the control unit is configured to determine said compensatory motion based on at least a control signal for control of the stage module.

15. An optical imaging system as defined in clause 14, wherein the control unit is further configured to determine said compensatory motion on a predicted dynamic behavior of the stage module during image acquisition.

16. An optical imaging system as defined in clause any of clauses 13 to 15, wherein the control unit is configured to control said stage module such that said image acquisition commences prior to said stage module becoming stationary and/or said sage module begins motion to perform a subsequent action prior to completion of said image acquisition.

17. An optical imaging system as defined in any preceding clause, wherein said control unit is operable to perform image processing said image so as to remove any motion blurring artefacts caused by any stage motion not compensated by said motion compensatory mechanism by estimating an de-blurred image from the acquired image and a predetermined motion blur kernel.

18. An optical imaging system as defined in clause 17, wherein said blur kernel is determined from an earlier-measured optical point spread function of the optical imaging system in combination with a known object motion trajectory belonging to an observed image with motion blur.

19. An optical imaging system as defined in clause 18, wherein said control unit is configured to correct for a motion-part of the blur kernel and a non-ideal optical point spread function.

20. An optical imaging system as defined in any of clauses 17 to 19, wherein said control unit is configured to use an iterative image restoration algorithm to estimate said de-blurred image from the acquired image and a predetermined motion blur kernel.

21. An optical imaging system as defined in any of clauses 17 to 19, wherein said control unit is configured to use a trained artificial intelligence model to estimate said de-blurred image from the acquired image and a predetermined motion blur kernel.

22. A method for imaging an object using an optical imaging system, comprising:

illuminating an area of the object with an illumination beam;

collecting at least one signal originating from the illuminated area of the object during an acquisition period during at least a portion of which said object is non-stationary;

acquiring an image from the at least one signal beam on an image sensor; and performing a compensatory motion of an optical element of the optical imaging system during said acquisition period to compensate for relative motion of the object with respect to an objective lens module used to collect the at least one signal during the acquisition period such that the image is maintained at substantially the same position on the image sensor during the acquisition period.

23. A method as defined in clause 22, wherein performing a compensatory motion of an optical element comprises performing a compensatory movement of the objective lens module or an optical element comprised therein.

24. A method as defined in clause 22, wherein performing a compensatory motion of an optical element comprises performing a compensatory movement of said image sensor.

25. A method as defined in clause 22, wherein performing a compensatory motion of an optical element comprises performing a compensatory movement of one or both of:

an image lens used to image the image on the image sensor; or a detection dynamic mirror used to reflect the at least one signal beam to the image sensor.

26. A method as defined in clause 22, wherein performing a compensatory motion of an optical element comprises performing a compensatory control of a digital micrometer device.

27. A method as defined in clause 26, comprising controlling the digital micrometer device to correct for aberrations simultaneously with said motion compensation.

28. A method as defined in clause 22 or 23, comprising illuminating said area of the object with the illumination beam via said objective lens.

29. A method as defined in any of clauses 22 to 27, comprising controlling the illumination beam such that the illumination beam moves substantially synchronously with the object motion so as to illuminate substantially the same area of the object during image acquisition.

30. A method as defined in any of clauses 22 to 29, comprising determining said compensatory motion based on at least a control signal for control of a stage module used to transport said object.

31. A method as defined in clause 30, comprising modeling the dynamic behavior of the stage module; and determining said compensatory motion based on the predicted dynamic behavior of the stage module during image acquisition.

32. A method as defined in clause 30 or 31, comprising controlling said stage module such that said acquisition period commences prior to said stage module becoming stationary and/or said sage module begins motion to perform a subsequent action prior to completion of said acquisition period.

33. A method as defined in any of clauses 22 to 32, further comprising performing image processing on said image so as to remove any motion blurring artefacts caused by any object motion by estimating an de-blurred image from the acquired image and a predetermined motion blur kernel.

34. A method as defined in clause 33, wherein said blur kernel is determined from an earlier-measured optical point spread function of the optical imaging system in combination with a known object motion trajectory belonging to an observed image with motion blur.

35. A method as defined in clause 34, comprising correcting for a motion-part of the blur kernel and a non-ideal optical point spread function.

36. A method as defined in any of clauses 33 to 35, comprising using an iterative image restoration algorithm to estimate said de-blurred image from the acquired image and a predetermined motion blur kernel.

37. A method as defined in any of clauses 33 to 35, comprising using a trained artificial intelligence model to estimate said de-blurred image from the acquired image and a predetermined motion blur kernel.

38. A metrology device comprising an optical system as defined in any of clauses 1 to 21.

39. A metrology device as defined in clause 38, comprising a scatterometer metrology apparatus, a level sensor or an alignment sensor.

40. An optical inspection device comprising an optical system as defined in any of clauses 1 to 21.

Note that all the concepts disclosed herein are equally applicable to any metrology tool for which it may be beneficial to image a moving sample. Such a sample may comprise any metrology target, such as used in post-processing metrology (e.g., overlay target, focus target, critical dimension or any other structural dimension target) and/or used prior to processing (e.g., an alignment mark). Any such target may be a dedicated target formed for the purpose of metrology, and/or actual product structures. The metrology tool may be of a type such as illustrated schematically in FIGS. 4 to 6, for example.

FIG. 16 is a block diagram that illustrates a computer system 1200 that may assist in implementing the methods and algorithm disclosed herein. Computer system 1200 includes a bus 1202 or other communication mechanism for communicating information, and a processor 1204 (or multiple processors 1204 and 1205) coupled with bus 1202 for processing information. Computer system 1200 also includes a main memory 1206, such as a random access memory (RAM) or other dynamic storage device, coupled to bus 1202 for storing information and instructions to be executed by processor 1204. Main memory 1206 also may be used for storing temporary variables or other intermediate information during execution of instructions to be executed by processor 1204. Computer system 1200 further includes a read only memory (ROM) 1208 or other static storage device coupled to bus 1202 for storing static information and instructions for processor 1204. A storage device 1210, such as a magnetic disk or optical disk, is provided and coupled to bus 1202 for storing information and instructions.

Computer system 1200 may be coupled via bus 1202 to a display 1212, such as a cathode ray tube (CRT) or flat panel or touch panel display for displaying information to a computer user. An input device 1214, including alphanumeric and other keys, is coupled to bus 1202 for communicating information and command selections to processor 1204. Another type of user input device is cursor control 1216, such as a mouse, a trackball, or cursor direction keys for communicating direction information and command selections to processor 1204 and for controlling cursor movement on display 1212. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1200 in response to processor 1204 executing one or more sequences of one or more instructions contained in main memory 1206. Such instructions may be read into main memory 1206 from another computer-readable medium, such as storage device 1210. Execution of the sequences of instructions contained in main memory 1206 causes processor 1204 to perform the process steps described herein. One or more processors in a multi-processing arrangement may also be employed to execute the sequences of instructions contained in main memory 1206. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1204 for execution. Such a medium may take many forms, including but not limited to, non-volatile media, volatile media, and transmission media. Non-volatile media include, for example, optical or magnetic disks, such as storage device 1210. Volatile media include dynamic memory, such as main memory 1206. Transmission media include coaxial cables, copper wire and fiber optics, including the wires that comprise bus 1202. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1204 for execution. For example, the instructions may initially be borne on a magnetic disk of a remote computer. The remote computer can load the instructions into its dynamic memory and send the instructions over a telephone line using a modem. A modem local to computer system 1200 can receive the data on the telephone line and use an infrared transmitter to convert the data to an infrared signal. An infrared detector coupled to bus 1202 can receive the data carried in the infrared signal and place the data on bus 1202. Bus 1202 carries the data to main memory 1206, from which processor 1204 retrieves and executes the instructions. The instructions received by main memory 1206 may optionally be stored on storage device 1210 either before or after execution by processor 1204.

Computer system 1200 also preferably includes a communication interface 1218 coupled to bus 1202. Communication interface 1218 provides a two-way data communication coupling to a network link 1220 that is connected to a local network 1222. For example, communication interface 1618 may be an integrated services digital network (ISDN) card or a modem to provide a data communication connection to a corresponding type of telephone line. As another example, communication interface 1218 may be a local area network (LAN) card to provide a data communication connection to a compatible LAN. Wireless links may also be implemented. In any such implementation, communication interface 1218 sends and receives electrical, electromagnetic or optical signals that carry digital data streams representing various types of information.

Network link 1220 typically provides data communication through one or more networks to other data devices. For example, network link 1220 may provide a connection through local network 1222 to a host computer 1224 or to data equipment operated by an Internet Service Provider (ISP) 1226. ISP 1226 in turn provides data communication services through the worldwide packet data communication network, now commonly referred to as the "Internet" 1228. Local network 1222 and Internet 1228 both use electrical, electromagnetic or optical signals that carry digital data streams. The signals through the various networks and the signals on network link 1220 and through communication interface 1218, which carry the digital data to and from computer system 1200, are exemplary forms of carrier waves transporting the information.

Computer system 1200 may send messages and receive data, including program code, through the network(s), network link 1220, and communication interface 1218. In the Internet example, a server 1230 might transmit a requested code for an application program through Internet 1228, ISP 1226, local network 1222 and communication interface 1218. One such downloaded application may provide for one or more of the techniques described herein, for example. The received code may be executed by processor 1204 as it is received, and/or stored in storage device 1210, or other non-volatile storage for later execution. In this manner, computer system 1200 may obtain application code in the form of a carrier wave.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An optical imaging system, comprising:
a stage configured to support an object such that an area of the object is illuminated by an illumination beam;
an objective lens comprising one or more optical elements and configured to collect a signal beam, the signal beam originating from the area of the object;
an image sensor configured to capture an image formed by the signal beam collected by the objective lens; and
a motion compensatory mechanism operable to compensate for relative motion of the stage with respect to the objective lens during an image acquisition by causing a compensatory motion of one or more of:
the objective lens and/or the one or more optical elements of the objective lens;
the image sensor; and/or
an optical element comprised within a detection branch and/or illumination branch of the optical imaging system,
wherein the motion compensatory mechanism comprises:
a dynamic mounting for the objective lens and/or the one or more optical elements of the objective lens, the dynamic mounting configured to allow the compensatory motion; and
an actuator configured to actuate the compensatory motion.

2. The optical imaging system of claim 1, wherein the motion compensatory mechanism is operable such that, during the image acquisition, the image is maintained at substantially a same position on the image sensor despite any motion of the stage during the image acquisition.

3. The optical imaging system of claim 1, wherein the motion compensatory mechanism further comprises:
a dynamic mounting for the image sensor enabling the compensatory motion; and
an actuator configured to actuate the compensatory motion.

4. The optical imaging system of claim 1, wherein the motion compensatory mechanism further comprises:
an optical element comprised within a detection branch and/or illumination branch and dynamic mounting therefor enabling the compensatory motion; and
an actuator configured to actuate the compensatory motion.

5. The optical system of claim 1, further comprising:
an illumination beam delivery system operable to controllably deliver the illumination beam to the object and the illumination beam delivery system comprising an illumination dynamic mirror configured to reflect the illumination beam to the area of the object such that the illumination beam moves substantially synchronously with the stage motion so as to illuminate substantially the same area of the object during image acquisition.

6. The optical imaging system of claim 1, further comprising a control unit configured to determine the compensatory motion for the motion compensatory mechanism.

7. The optical imaging system of claim 6, wherein the control unit is configured to determine the compensatory motion based on a control signal for control of the stage.

8. The optical imaging system of claim 7, wherein the control unit is further configured to determine the compensatory motion based on a predicted dynamic behavior of the stage during image acquisition.

9. A method comprising:
illuminating an area of an object with an illumination beam;
collecting, with an objective lens, a signal originating from the area of the object during an acquisition period, wherein the object is non-stationary during a portion of the acquisition period;
acquiring an image from the signal beam on an image sensor; and
performing, with an actuator, a compensatory motion of the objective lens during the acquisition period to compensate for relative motion of the object with respect to the objective lens such that the image is maintained at substantially the same position on the image sensor during the acquisition period.

10. The method of claim 9, further comprising controlling the illumination beam such that the illumination beam moves substantially synchronously with the object motion so as to illuminate substantially a same area of the object during image acquisition.

11. The method of claim 9, further comprising determining the compensatory motion based on a control signal for control of a stage used to transport the object.

12. The method of claim 11, further comprising:
modeling the dynamic behavior of the stage; and
determining the compensatory motion based on the predicted dynamic behavior of the stage during image acquisition.

13. The method of claim 9, further comprising performing, with an actuator, a compensatory motion of the image sensor such that the image is maintained at substantially the same position on the image sensor during the acquisition period.

14. The method of claim 9, further comprising performing, with an actuator, a compensatory motion of one or both of an image lens or a detection dynamic mirror such that the image is maintained at substantially the same position on the image sensor during the acquisition period;
wherein the image lens is configured to image the image on the image sensor and the detection dynamic mirror configured to reflect the signal beam to the image sensor.

15. A metrology device comprising:
a stage configured to support an object such that an area of the object is illuminated by an illumination beam;
an objective lens comprising one or more optical elements and configured to collect a signal beam, the signal beam originating from the area of the object;
an image sensor configured to capture an image formed by the signal beam collected by the objective lens; and
a motion compensatory mechanism operable to compensate for relative motion of the stage with respect to the objective lens during an image acquisition by causing a compensatory motion of one or more of:
the objective lens and/or the one or more optical elements of the objective lens;
the image sensor; and/or
an optical element comprised within a detection branch and/or illumination branch of the optical imaging system,
wherein the motion compensatory mechanism comprises:
a dynamic mounting for the objective lens and/or the one or more optical elements of the objective lens, the dynamic mounting configured to allow the compensatory motion; and
an actuator configured to actuate the compensatory motion.

16. The metrology device of claim 15, wherein the motion compensatory mechanism is operable such that, during the image acquisition, the image is maintained at substantially a same position on the image sensor despite any motion of the stage during the image acquisition.

17. The metrology device of claim 15, further comprising:
an illumination beam delivery system operable to controllably deliver the illumination beam to the object and the illumination beam delivery system comprising an illumination dynamic mirror configured to reflect the illumination beam to the area of the object such that the illumination beam moves substantially synchronously with the stage motion so as to illuminate substantially the same area of the object during image acquisition.

18. An optical inspection device comprising:
a stage configured to support an object such that an area of the object is illuminated by an illumination beam;
an objective lens comprising one or more optical elements and configured to collect a signal beam, the signal beam originating from the area of the object;
an image sensor configured to capture an image formed by the signal beam collected by the objective lens; and
a motion compensatory mechanism operable to compensate for relative motion of the stage with respect to the objective lens during an image acquisition by causing a compensatory motion of one or more of:
the objective lens and/or the one or more optical elements of the objective lens;
the image sensor; and/or
an optical element comprised within a detection branch and/or illumination branch of the optical imaging system,
wherein the motion compensatory mechanism comprises:
a dynamic mounting for the objective lens and/or the one or more optical elements of the objective lens, the dynamic mounting configured to allow the compensatory motion; and
an actuator configured to actuate the compensatory motion.

19. The optical inspection device of claim 18, wherein the motion compensatory mechanism is operable such that, during the image acquisition, the image is maintained at substantially a same position on the image sensor despite any motion of the stage during the image acquisition.

20. The optical inspection device of claim 18, further comprising:
an illumination beam delivery system operable to controllably deliver the illumination beam to the object and the illumination beam delivery system comprising an illumination dynamic mirror configured to reflect the illumination beam to the area of the object such that the illumination beam moves substantially synchronously with the stage motion so as to illuminate substantially the same area of the object during image acquisition.

* * * * *